United States Patent
Kim

(10) Patent No.: US 11,821,954 B2
(45) Date of Patent: Nov. 21, 2023

(54) DEVICE FOR SENSING VOLTAGE OF HIGH-VOLTAGE BATTERY

(71) Applicants: Hyundai Motor Company, Seoul (KR); Kia Corporation, Seoul (KR)

(72) Inventor: Jin Won Kim, Pyeongtaek-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 38 days.

(21) Appl. No.: 17/475,754

(22) Filed: Sep. 15, 2021

(65) Prior Publication Data
US 2022/0342000 A1    Oct. 27, 2022

(30) Foreign Application Priority Data
Apr. 22, 2021    (KR) .................... 10-2021-0052483

(51) Int. Cl.
*G01R 31/3835*    (2019.01)
*H01M 10/48*    (2006.01)

(52) U.S. Cl.
CPC ...... *G01R 31/3835* (2019.01); *H01M 10/482* (2013.01)

(58) Field of Classification Search
None
See application file for complete search history.

(56) References Cited

U.S. PATENT DOCUMENTS

2019/0393470 A1*  12/2019  In ..................... H01M 50/502

FOREIGN PATENT DOCUMENTS

| CN | 215816176 U | * | 2/2022 |
| JP | 2018098074 A | * | 6/2018 |
| KR | 10-1491323 B1 | | 2/2015 |
| KR | 10-1769009 B1 | | 8/2017 |
| KR | 10-2118661 B1 | | 6/2020 |
| KR | 10-2020-0131493 A | | 11/2020 |

* cited by examiner

*Primary Examiner* — Patrick Assouad
*Assistant Examiner* — Haidong Zhang
(74) *Attorney, Agent, or Firm* — Morgan, Lewis & Bockius LLP

(57) ABSTRACT

An apparatus for detecting a voltage of a high-voltage battery, may include a voltage sensing portion configured to detect a voltage of the high-voltage battery; a transmission wire connected to the voltage sensing portion to transmit the voltage of the battery, detected by the voltage sensing portion, to the outside of the apparatus; a cover of covering a position in which the voltage sensing portion is connected to the transmission wire; and a foam pad, which is disposed inside the cover, is formed of a material, a volume of which increases when heat is transferred thereto, and when heat is generated, expands to prevent the heat from being transferred to the voltage sensing portion or the battery or to release a connection between the transmission wire and the voltage sensing portion.

11 Claims, 5 Drawing Sheets

DEVICE FOR SENSING VOLTAGE OF HIGH-VOLTAGE BATTERY

CROSS REFERENCE TO RELATED APPLICATION

The present application claims priority to Korean Patent Application No. 10-2021-0052483, filed Apr. 22, 2021, the entire contents of which is incorporated herein for all purposes by this reference.

BACKGROUND OF THE INVENTION

Field of the Invention

The present invention relates to a device for detecting the voltage of a high-voltage battery, and more specifically, to a technology regarding a connector for connecting a device for detecting the voltage of a high-voltage battery with transmission wire connected to the outside.

Description of Related Art

There has recently been gradual transition from internal combustion engine cars to hybrid cars and from hybrid cars to electric cars. This has been followed by extensive development regarding high-voltage batteries for electric cars and device configured for assisting the same.

Such assisting devices include safety connectors configured to block power supply from high-voltage batteries. Currents always flow within high-voltage batteries, and if a vehicle is repaired without blocking power supply from the battery thereof, a fatal electric shock may occur. For the present reason, the above-mentioned safety connectors are indispensable.

However, conventional safety connectors have a problem in that, since a fuse is embedded therein, a large installation height is required, and the peripheral space is narrowed by an anti-vibration structure provided to absorb vibrations occurring in the vehicle, making it difficult to install an additional structure.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing an apparatus configured for detecting the voltage of a high-voltage battery, wherein a foam pad configured to expand in a response to detecting heat is attached to a cover of a connector for connecting the apparatus and a transmission wire connected to the outside such that, if the transmission wire generates heat, the foam pad expands and blocks transfer of heat to the apparatus.

An apparatus configured for detecting a voltage of a high-voltage battery according to various exemplary embodiments of the present invention includes: a voltage sensing portion configured to detect a voltage of the high-voltage battery; a transmission wire connected to the voltage sensing portion to transmit the voltage of the battery, detected by the voltage sensing portion, to the outside of the apparatus; a cover of covering a position in which the voltage sensing portion is connected to the transmission wire; and a foam pad disposed inside the cover, formed of a material, a volume of which increases when heat is transferred thereto, and configured to expand, when the heat is transferred thereto, to prevent the heat from being transferred to the voltage sensing portion or the battery or to release a connection between the transmission wire and the voltage sensing portion.

The apparatus may further include a connector connecting the transmission wire to the voltage sensing portion, and the cover may cover a position in which the connector is connected to the transmission wire.

The high-voltage battery may include a plurality of stacked cells. The voltage sensing portion may include a plurality of sensing wires connected to the plurality of stacked cells, respectively. The connector may include a plurality of pins formed such that the sensing wires are connected thereto while being spaced from each other in a predetermined direction thereof.

The transmission wire may include wire portions formed as a plurality of wires and connected to the plurality of pins, respectively, and a bundle portion in which the wire portions are bundled. The foam pad may be disposed in the predetermined direction inside the cover and configured to expand in a direction perpendicular to the predetermined direction thereof.

A pair of foam pads may be disposed at both sides inside the cover.

Sensing wires, which are connected to the stacked cells having relatively small potential differences, among the plurality of sensing wires, may be adjacently connected to the pins.

The cover may include a fixing portion of fixing the cover to the voltage sensing portion.

The cover may include a hinge portion disposed to allow one side of the cover to be rotated and opened.

The connector may include clip portion configured to hold or release the connection between the connector and the voltage sensing portion. The cover may include an opening through which the clip portion is exposed to the outside.

An apparatus configured for detecting a voltage of a high-voltage battery according to various exemplary embodiments of the present invention is advantageous in that a foam pad configured to expand if heat is generated is provided on a cover of a connector for connecting a voltage sensing portion configured to detect the voltage of a high-voltage battery and a transmission wire configured to transmit detected voltage information to the outside such that, if the transmission wire generates heat, the foam pad expands and disconnects the transmission wire and the connector, blocking transfer of heat to the voltage sensing portion or the high-voltage battery.

Furthermore, the foam pad is positioned on both sides in a direction parallel to the direction in which the transmission wire extends inside the cover such that, when expanded, the same can rapidly disconnect the transmission wire and the connector.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
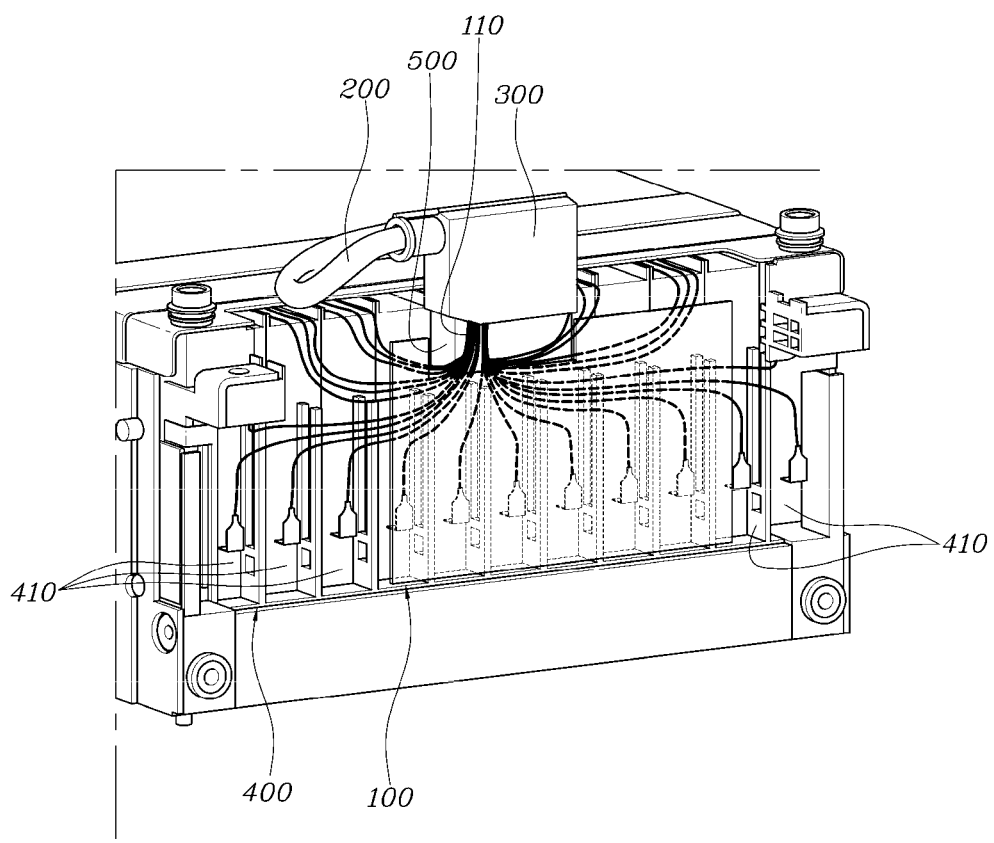
FIG. 1 is a perspective view of a device for detecting the voltage of a high-voltage battery according to various exemplary embodiments of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

A specific structural or functional description of embodiments of the present invention included in the specification or application is provided merely for describing the exemplary embodiment according to various exemplary embodiments of the present invention. Therefore, the exemplary embodiments according to various exemplary embodiments of the present invention may be implemented in various forms, and the present invention should not be construed as being limited to the exemplary embodiments described in the specification or application.

Various changes and modifications may be made to the exemplary embodiments according to various exemplary embodiments of the present invention, and therefore various exemplary embodiments will be illustrated in the drawings and described in the specification or application. However, it should be understood that embodiments according to the concept of the present invention are not limited to the particular disclosed exemplary embodiments of the present invention, but the present invention includes all modifications, equivalents, and alternatives falling within the spirit and scope of the present invention.

Such terms as "a first" and/or "a second" may be used to described various elements, but the elements should not be limited by these terms. These terms are intended merely to distinguish one element from other elements. For example, a first element may be named a second element and similarly a second element may be named a second element without departing from the scope of protection of the present invention.

In the case where an element is referred to as being "connected" or "accessed" to other elements, it should be understood that not only the element is directly connected or accessed to the other elements, but also another element may exist between them. Contrarily, in the case where a component is referred to as being "directly connected" or "directly accessed" to any other component, it should be understood that there is no component therebetween. The other expressions of describing a relation between structural elements, i.e. "between" and "merely between" or "neighboring" and "directly neighboring", should be interpreted similarly to the above description.

The terms used in various exemplary embodiments of the present invention are merely used to describe specific embodiments, and are not intended to limit the present invention. A singular expression may include a plural expression unless they are definitely different in a context. As used herein, the expression "include" or "have" are intended to specify the existence of mentioned features, numbers, steps, operations, elements, components, or combinations thereof, and should be construed as not precluding the possible existence or addition of one or more other features, numbers, steps, operations, elements, components, or combinations thereof.

Unless defined otherwise, all terms used herein, including technical and scientific terms, have the same meaning as those commonly understood by a person skilled in the art to which various exemplary embodiments of the present invention pertains. Such terms as those defined in a generally used dictionary may be interpreted to have the meanings equal to the contextual meanings in the relevant field of art, and are not to be interpreted to have ideal or excessively formal meanings unless clearly defined in various exemplary embodiments of the present invention.

Hereinafter, various exemplary embodiments of the present invention will be described in detail with reference to the accompanying drawings. The same or like reference signs presented in the drawings designate the same or like elements.

Figure 2:
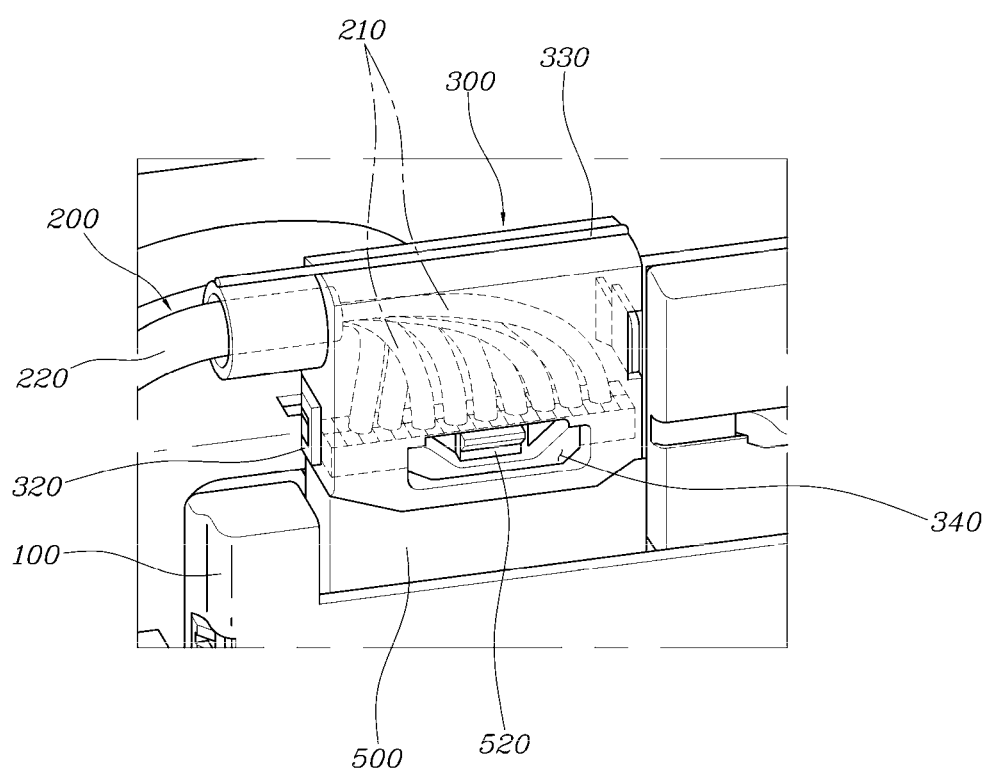
FIG. 2 is an enlarged view of a cover of a device for detecting the voltage of a high-voltage battery according to various exemplary embodiments of the present invention.
Figure 3:
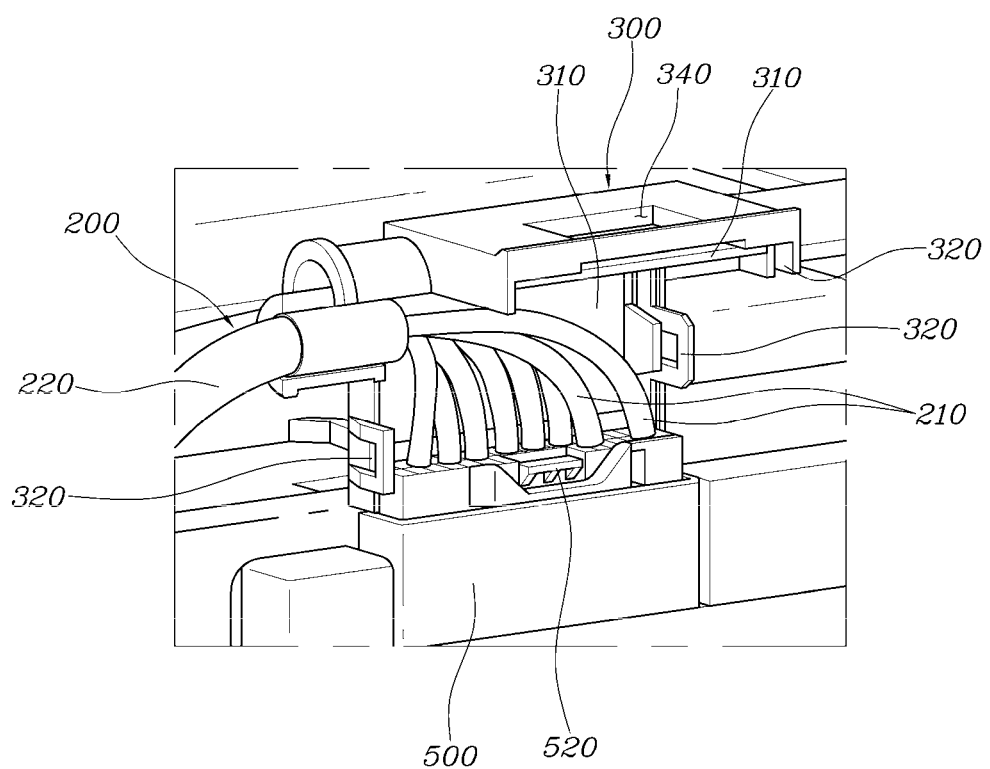
FIG. 3 illustrates a state in which a cover of a device for detecting the voltage of a high-voltage battery according to various exemplary embodiments of the present invention is opened.
Figure 4:
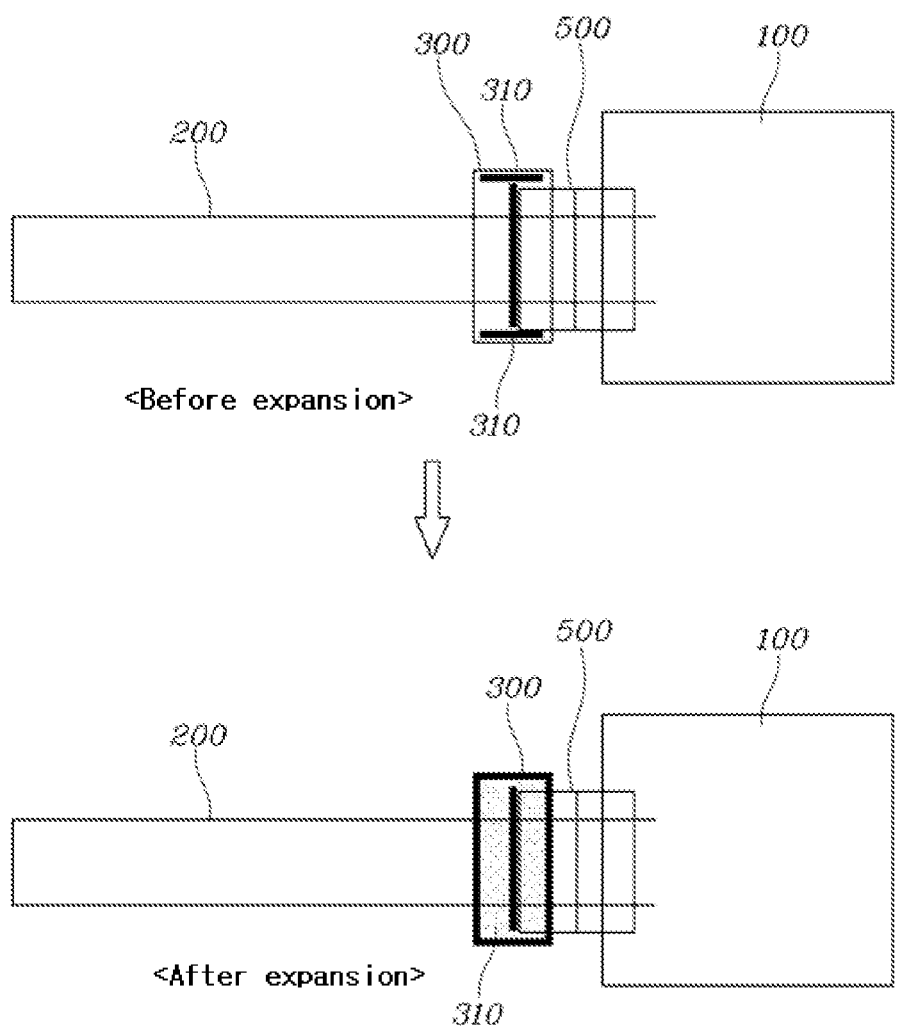
FIG. 4 is a simplified view of a device for detecting the voltage of a high-voltage battery according to various exemplary embodiments of the present invention.
Figure 5:
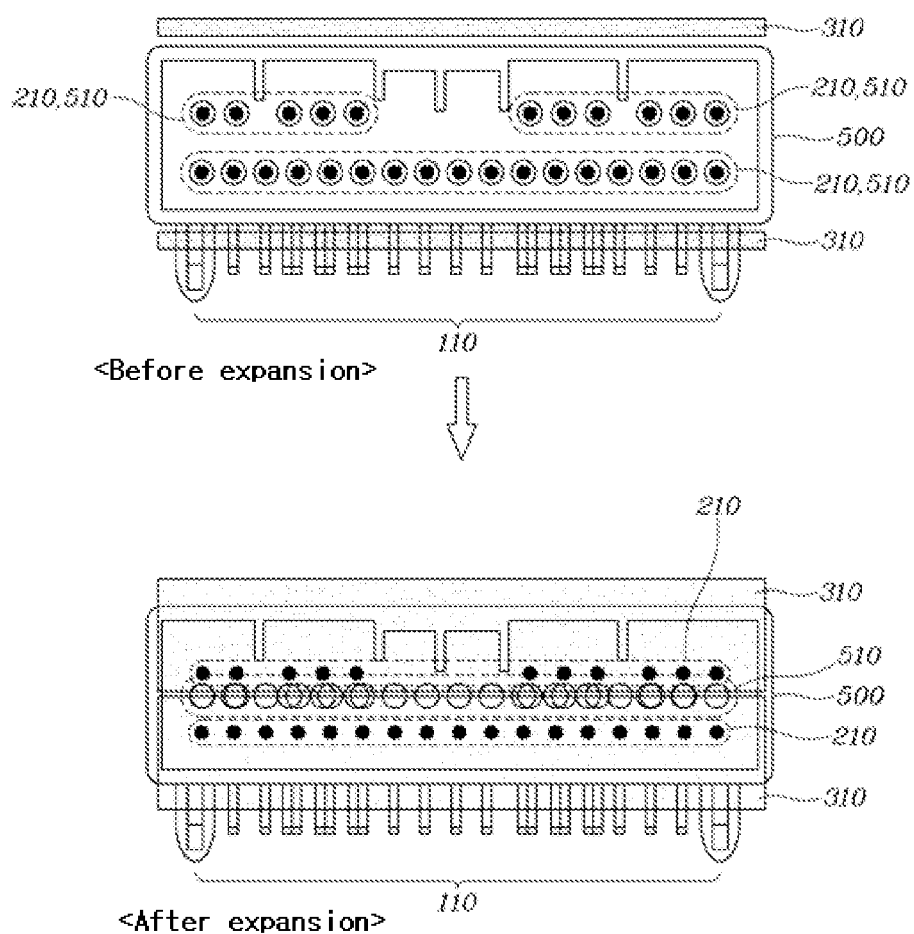
FIG. 5 is a plan view of a connector of a device for detecting the voltage of a high-voltage battery according to various exemplary embodiments of the present invention.

FIG. 1 is a perspective view of a device configured for detecting the voltage of a high-voltage battery 400 according to various exemplary embodiments of the present invention. FIG. 2 is an enlarged view of a cover 300 of the device configured for detecting the voltage of the high-voltage battery 400 according to various exemplary embodiments of the present invention. FIG. 3 illustrates a state in which the cover 300 of the device configured for detecting the voltage of the high-voltage battery 400 according to various exemplary embodiments of the present invention is opened. FIG. 4 is a simplified view of the device configured for detecting the voltage of the high-voltage battery 400 according to various exemplary embodiments of the present invention. FIG. 5 is a plan view of a connector 500 of the device configured for detecting the voltage of the high-voltage battery 400 according to various exemplary embodiments of the present invention.

An exemplary embodiment of the device configured for detecting the voltage of the high-voltage battery 400 according to various exemplary embodiments of the present invention will be described with reference to FIG. 1, FIG. 2, FIG. 3, FIG. 4, and FIG. 5.

The device configured for detecting the voltage of the high-voltage battery 400 according to various exemplary embodiments of the present invention has been provided to detect an abnormal voltage of the high-voltage battery 400 disposed in a vehicle, and may issue a warning signal to a driver when the abnormal voltage of the battery is detected.

The device configured for detecting the voltage of the high-voltage battery 400 according to various exemplary embodiments of the present invention includes: a voltage sensing portion 100 configured to detect a voltage of the high-voltage battery 400; a transmission wire 200 connected to the voltage sensing portion 100 to transmit the voltage of the battery, detected by the voltage sensing portion 100, to the outside of the device; a cover 300 configured to cover a position in which the voltage sensing portion 100 is connected to the transmission wire 200; and a foam pad 310, which is disposed inside the cover 300, is formed of a material having a volume increasing when heat is detected in an adjacent position, and when heat is generated, expands to block the heat transferred to the voltage sensing portion 100 or the battery or to release the connection between the transmission wire 200 and the voltage sensing portion 100.

As illustrated in FIG. 1, FIG. 2, FIG. 3, FIG. 4, and FIG. 5, the voltage sensing portion 100 may be connected to the high-voltage battery 400 provided in a vehicle to detect the voltage of the battery. The voltage sensing portion 100 may be connected to both end portions of the high-voltage battery 400, corresponding to a positive (+) electrode and a negative (−) electrode, to measure the voltage of the high-voltage battery 400, and when the voltage of the high-voltage battery 400 decreases or increases, may convert the changed voltage into an electrical signal and transmit the electrical signal to the outside.

The transmission wire 200 may be connected at one end portion thereof to the voltage sensing portion 100 and connected at the other end portion thereof to a battery management unit provided as another element. The battery management unit may check the voltage of the battery in real time and may notify a driver of the checked voltage.

The cover 300 may be disposed to cover a position in which the transmission wire 200 is connected to the voltage sensing portion 100, and thus may prevent foreign matter such as outside dust or water from being introduced into the position in which the transmission wire 200 is connected to the voltage sensing portion 100.

When foreign matter such as outside dust or water is introduced into the high-voltage battery 400 through the voltage sensing portion 100 in the position in which the transmission wire 200 is connected to the voltage sensing portion 100, a short circuit may occur in a circuit of the high-voltage battery 400 to produce sparks, and fire may break out in serious cases.

The foam pad 310 is disposed inside the cover 300, and when heat is generated in the transmission wire 200 by introduction of foreign matter such as outside dust or water through a gap caused by coupling of the cover 300, can expand thus can release a connection between the voltage sensing portion 100 and the transmission wire 200. Furthermore, the foam pad 310 can block heat of the transmission wire 200 to protect the high-voltage battery and the voltage sensing portion 100.

The foam pad 310 is an electric fire stop (EFS) foam pad 310, and is a foam pad 310 optimized for the construction of cables used for electricity, electronics, and communication.

The foam pad 310 (fire-resistant polyurethane foam) is produced by reacting an isocyanate component with a polyol component in the presence of a foaming agent and a fire-resistant additive.

That is, one or a combination of catalysts such as expandable graphite, pentaerythritol, ammonium phosphate, and polyhydric alcohol is used with respect to the polyol such that the expansion action of the foaming agent forms char between connection rings of polyol and diisocyanate, forming a film. The film prevents the molecular ring of the polyol from being dissolved by heat, improving the vulnerability to fire, which is a problem of the conventional polyurethane foam, and also preventing the generation of toxic gases in the case of a fire.

Thus, when heat is generated in the transmission wire 200 due to a short circuit caused by infiltration of outside water into the transmission wire 200, the foam pad 310 may hermetically seal the internal space of the cover 300 by expanding due to a thermal expansion property, and thus the transmission wire 200 is fused and cut by the blocked heat or a connection between the transmission wire 200 and the voltage sensing portion 100 is released. Therefore, the heat of the transmission wire 200 may be prevented from being transferred to the voltage sensing portion 100 or the high-voltage battery 400, preventing the voltage sensing portion 100 or the high-voltage battery 400 from malfunctioning.

The device may further include a connector 500 configured to connect the transmission wire 200 to the voltage sensing portion 100, and the cover 300 may cover a position in which the connector 500 is connected to the transmission wire 200.

The transmission wire 200 may be connected at one side thereof to the connector 500, and the connector 500 may be connected to the voltage sensing portion 100. Therefore, the transmission wire 200 may be easily connected to the voltage sensing portion 100, and assemblability can become excellent.

Furthermore, the cover 300 is placed to cover a position in which the connector 500 is connected to the transmission wire 200. Water may infiltrate into the position in which the connector is connected to the transmission wire 200, and thus the cover 300 can cover the above-described position, reducing the probability that a short circuit will occur in the transmission wire 200.

The high-voltage battery 400 may include a plurality of stacked battery cells 410. The voltage sensing portion 100 may include a plurality of sensing wires 110 connected to the plurality of stacked battery cells 410, respectively. The connector 500 may include a plurality of pins 510 formed such that the sensing wires 110 are connected thereto while being spaced from each other in a first direction thereof.

The high-voltage battery 400 may be formed by stacking the plurality of battery cells 410, the voltage sensing portion 100 may include sensing wires 110 connected to the positive (+) electrodes and negative (−) electrodes of the respective battery cells 410 to measure the voltage of the battery cells 410, the sensing wires 110 may be connected to the pins 510 of the connector 500 while being spaced from each other at regular intervals, and the transmission wire 200 may be connected to the pins 510 of the connector 500 so that the transmission wire 200 may be connected to the sensing wires 110.

Therefore, as illustrated in FIG. 5, it is possible to prevent a short circuit from occurring due to contact between the sensing wires 110 when the positions of the sensing wires 110 are moved by expansion of the foam pad 310 in the state in which the sensing wires 110 are connected to the connector 500.

The transmission wire 200 may include: wire portions 210 formed as a plurality of wires and connected to the plurality of pins 510, respectively; and a bundle portion 220 in which the wire portions 210 are bundled. The foam pad 310 may be disposed in the first direction inside the cover 300 and may expand in a direction perpendicular to the first direction thereof.

As illustrated in FIG. 5, the plurality of wire portions 210 of the transmission wire 200 may be connected to the connector 500 in a direction in which the pins 510 extend, and the cover 300 may cover a position in which the wire portions 210 are connected to the connector 500, protecting the wire portions 210 which are more vulnerable to outside foreign matter than the bundle portion 220 is.

Furthermore, the foam pad 310 is placed in the first direction in which the wire portions 210 extend, is disposed to expand in a direction perpendicular to the first direction thereof, and is placed at a wide side inside the cover 300. Therefore, when heat is generated in the transmission wire 200, the foam pad 310 can rapidly expand to block the heat of the transmission wire 200 or to release a connection between the transmission wire 200 and the connector 500.

A pair of foam pads 310 may be disposed at both sides inside the cover 300.

As illustrated in FIG. 4 and FIG. 5, the foam pad 310 may be disposed at each of both sides inside the cover 300, and when expanding, may move the wire portions 210 of the transmission wire 200 to the center portion of the connector, and may release a connection between the wire portions 210 and the connector 500.

Since the foam pad 310 is disposed at each of both sides inside the cover 300, it is possible to reduce a time required to fill the inside of the cover 300 with the foam pad 310 and to rapidly cope with heat generated from the transmission wire 200.

Sensing wires 110, which are connected to the battery cells 410 having relatively small potential differences, among the plurality of sensing wires 110, may be adjacently connected to the pins 510.

When the sensing wires 110 are connected to the pins 510 of the connector 500, the sensing wires 110 connected to the battery cells having relatively small potential differences may be adjacently connected to the pins 510.

Therefore, as illustrated in FIG. 5, even when a short circuit occurs due to mutual contact between the wire portions 210 while the wire portions 210 are moved to the center portion of the connector 500 by the foam pad 310, the probability of sparking may be reduced by the smaller potential differences.

The cover 300 may include a hinge portion 330 disposed to allow one side of the cover 300 to be rotated and opened.

As illustrated in FIG. 3, the hinge portion 330 may be disposed on the top portion or the side portion of the cover 300 to allow one side of the cover 300 to be rotated and opened. Thus, the cover 300 may be opened while the foam pad 310 placed inside the cover 300, the wired portions 210, or the connector 500 is maintained.

In an exemplary embodiment of the present invention, the cover 300 and the transmission wire 200 are pivotally connected by the hinge portion 330 to allow one side of the cover 300 to be rotated with respect to the transmission wire 200.

Therefore, it is possible to increase convenience in maintenance of the foam pad 310, the wire portions 210, or the connector 500.

The cover 300 may include a fixing portion 320 configured to fix the cover 300 to the voltage sensing portion 100.

When the cover 300 is connected to the connector 500, the fixing portion 320 may fix the cover 300 to the connector 500, protecting the wire portions 210 connected to the outside and the connector 500, and may fix one side of the cover 300, which is opened by the hinge portion 330.

Therefore, outside dust and water may be prevented from infiltrating into the cover 300. Furthermore, the fixing portion 320 is configured to be fixed or released, and thus convenience in the maintenance inside the cover 300 may be improved.

The connector 500 may include a clip portion 520 configured to hold or release connection of the connector 500 to the voltage sensing portion 100, and the cover 300 may include an opening 340 through which the clip portion 520 is exposed to the outside.

The clip portion 520 may be disposed at the connector 500 to connect or disconnect the voltage sensing portion 100 to or from the connector 500, and the cover 300 may have the opening 340 formed to allow the clip portion 520 to be externally exposed therethrough.

Therefore, during the maintenance of the voltage sensing portion 100, the connector 500 may be separated from the voltage sensing portion 100 in the state in which the connector 500 is coupled to the cover 300 by the clip portion 520 exposed through the opening 340, and thus convenience in the maintenance thereof may be improved.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. An apparatus for detecting a voltage of a battery, the apparatus comprising:
   a voltage sensing portion configured to detect the voltage of the battery;
   a transmission wire connected to the voltage sensing portion to transmit the voltage of the battery, detected by the voltage sensing portion, to the outside of the apparatus;
   a cover of covering a position in which the voltage sensing portion is connected to the transmission wire; and
   a foam pad disposed inside the cover, formed of a material, a volume of which increases when heat is transferred thereto, and configured to expand, when the heat is transferred thereto, to prevent the heat from being transferred to the voltage sensing portion or the battery or to release a connection between the transmission wire and the voltage sensing portion, wherein the cover includes a hinge portion disposed to allow a side of the cover to be rotated and opened.

2. The apparatus of claim 1, further including:
a connector connecting the transmission wire to the voltage sensing portion.

3. The apparatus of claim 2, wherein the cover is positioned to cover a place in which the connector is connected to the transmission wire.

4. The apparatus of claim 3,
wherein the battery includes a plurality of stacked cells,
wherein the voltage sensing portion includes a plurality of sensing wires connected to the plurality of stacked cells, respectively, and
wherein the connector includes a plurality of pins and the plurality of sensing wires is connected to the plurality of pins while being spaced from each other in a predetermined direction thereof.

5. The apparatus of claim 4,
wherein the transmission wire includes wire portions formed as a plurality of wires and connected to the plurality of pins, respectively, and a bundle portion in which the wire portions are bundled, and
wherein the foam pad is disposed in the predetermined direction inside the cover and configured to expand in a direction perpendicular to the predetermined direction.

6. The apparatus of claim 1, wherein a pair of foam pads is respectively disposed at first and second sides inside the cover.

7. The apparatus of claim 4, wherein, among the plurality of sensing wires, sensing wires which are connected to stacked cells having relatively small potential differences among the plurality of stacked cells, are adjacently connected to the plurality of pins.

8. The apparatus of claim 1, wherein the cover includes a fixing portion of fixing the cover to the voltage sensing portion.

9. The apparatus of claim 1, wherein the transmission wire and the cover is pivotally connected by the hinge portion of the cover to allow the side of the cover to be rotated with respect to the transmission wire.

10. The apparatus of claim 2, wherein the connector includes a clip portion configured to hold or release the connection between the connector and the voltage sensing portion.

11. The apparatus of claim 10, wherein the cover includes an opening through which the clip portion is exposed to the outside.

* * * * *